(12) United States Patent
Fujikawa

(10) Patent No.: US 11,427,927 B2
(45) Date of Patent: Aug. 30, 2022

(54) SIC SINGLE CRYSTAL MANUFACTURING APPARATUS AND STRUCTURE HAVING CONTAINER AND FILLER FOR MANUFACTURING SIC SINGLE CRYSTAL

(71) Applicant: SHOWA DENKO K.K., Tokyo (JP)

(72) Inventor: Yohei Fujikawa, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 85 days.

(21) Appl. No.: 16/711,826

(22) Filed: Dec. 12, 2019

(65) Prior Publication Data

US 2020/0190691 A1 Jun. 18, 2020

(30) Foreign Application Priority Data

Dec. 14, 2018 (JP) .............................. JP2018-234850

(51) Int. Cl.
| | |
|---|---|
| *C30B 35/00* | (2006.01) |
| *C30B 23/06* | (2006.01) |
| *C23C 14/24* | (2006.01) |
| *C23C 14/06* | (2006.01) |
| *C30B 29/36* | (2006.01) |

(52) U.S. Cl.
CPC ........ *C30B 23/066* (2013.01); *C23C 14/0635* (2013.01); *C23C 14/243* (2013.01); *C30B 29/36* (2013.01); *C30B 35/002* (2013.01)

(58) Field of Classification Search
CPC ......... C30B 23/00; C30B 23/02; C30B 23/06; C30B 23/063; C30B 29/00; C30B 29/10; C30B 29/36; C30B 35/00; C30B 35/002; C23C 14/0635; C23C 14/243

USPC ..................... 117/84, 88, 200, 204, 937, 951
See application file for complete search history.

(56) References Cited

U.S. PATENT DOCUMENTS

| | | | | |
|---|---|---|---|---|
| 2004/0194694 | A1* | 10/2004 | Sugiyama | ......... C23C 16/45591 |
| | | | | 117/200 |
| 2006/0280640 | A1* | 12/2006 | Schlesser | ............ C04B 35/5607 |
| | | | | 419/14 |
| 2012/0308758 | A1* | 12/2012 | Hori | ........................ C30B 23/00 |
| | | | | 428/64.1 |

(Continued)

FOREIGN PATENT DOCUMENTS

| | | |
|---|---|---|
| CN | 201713326 U | 1/2011 |
| CN | 205711045 U | 11/2016 |
| JP | 3490628 B2 | 1/2004 |

(Continued)

OTHER PUBLICATIONS

Communication dated May 7, 2021, from the China National Intellectual Property Administration in application No. 201911262477.6.

*Primary Examiner* — Kenneth A Bratland, Jr.
(74) *Attorney, Agent, or Firm* — Sughrue Mion, PLLC

(57) ABSTRACT

A SiC single crystal manufacturing apparatus of the present invention includes a growth container having a growth space in which a SiC single crystal is grown in a first direction and a heat insulating material which covers the growth container and includes a plurality of units, and the plurality of units include a first unit and a second unit having at least a thermal conductivity different from that of the first unit, and the first unit includes a container made of at least one of graphite and a metal carbide and a filler filled into the container in a replaceable manner.

9 Claims, 4 Drawing Sheets

(56) References Cited

U.S. PATENT DOCUMENTS

2015/0152569 A1* 6/2015 Okada .................... C30B 29/36
117/28

FOREIGN PATENT DOCUMENTS

| JP | 2006-143497 | A |   | 6/2006 |
|----|-------------|---|---|--------|
| JP | 2006143497  | A | * | 6/2006 |
| JP | 2015-086113 | A |   | 5/2015 |
| JP | 6584007     | B2 |  | 10/2019 |

* cited by examiner

SIC SINGLE CRYSTAL MANUFACTURING APPARATUS AND STRUCTURE HAVING CONTAINER AND FILLER FOR MANUFACTURING SIC SINGLE CRYSTAL

BACKGROUND OF THE INVENTION

Field of the Invention

The present invention relates to a SiC single crystal manufacturing apparatus and a structure for manufacturing a SiC single crystal.

Priority is claimed on Japanese Patent Application No. 2018-234850, filed Dec. 14, 2018, the content of which is incorporated herein by reference.

Description of Related Art

Compared to silicon (Si), silicon carbide (SiC) has an insulation breakdown electric field that is one order of magnitude larger and a band gap three times larger. In addition, silicon carbide (SiC) has a thermal conductivity that is about three times that of silicon (Si). Silicon carbide (SiC) is expected to be able to be applied to power devices, high frequency devices, high temperature operation devices, and the like.

A SiC epitaxial wafer is produced by growing a SiC epitaxial film serving as an active region of a SiC semiconductor device on a SiC single crystal substrate according to a chemical vapor deposition (CVD) method.

The SiC single crystal substrate is produced by cutting a SiC single crystal. The SiC single crystal is obtained by a crystal growth method such as a sublimation method. The sublimation method is a method in which a seed crystal made of a SiC single crystal is provided on a pedestal disposed in a graphite crucible, the crucible is heated so that a sublimation gas sublimated from a raw material powder in the crucible is supplied to the seed crystal, and the seed crystal is grown into a larger SiC single crystal.

In recent years, according to market demands, it has become necessary to increase the diameter of a SiC single crystal substrate on which a SiC epitaxial film is grown. Therefore, there is an increasing demand for increasing the diameter and length of the SiC single crystal itself. Along with the demand for increasing the diameter and length of SiC single crystals, there is also an increasing demand for high quality. In crystal growth of SiC single crystals, there are various factors that affect quality.

A temperature in a growth space during crystal growth of a SiC single crystal is one factor that affects the quality of the SiC single crystal. The SiC single crystal is grown at a high temperature of close to 2,000° C. A heat insulating material is provided around a growth container so that the temperature in the growth space does not decrease. Regarding the heat insulating material, a molded heat insulating material using carbon fibers or the like may be used (for example, Patent Document 1).

In addition, in Patent Document 2, a heat insulating material in which a core component made of a heat-resistant inorganic fiber assembly such as a SiC whisker is covered with a skin material such as an alumina fiber cloth is described.

PATENT DOCUMENTS

[Patent Document 1] Japanese Unexamined Patent Application, First Publication No. 2015-086113
[Patent Document 1] Japanese Patent No. 3490628

SUMMARY OF THE INVENTION

However, in the molded heat insulating material described in Patent Document 1, since there may be a distribution in thermal insulation properties due to uneven heating or the like during production, the thermal insulation properties cannot be sufficiently controlled and reproducibility of the temperature distribution in the growth container is low. In addition, the heat insulating material described in Patent Document 2 is used for aircraft such as a spaceshuttles and rockets. The alumina fiber cloth has a heat resistance of about 1,500° C., but it cannot withstand a SiC single crystal growth temperature. Therefore, there is a need for a heat insulating material of which thermal insulation properties can be controlled and which has heat resistance with respect to a SiC single crystal growth temperature.

The present invention has been made in view of the above circumstances and an object of the present invention is to provide a SiC single crystal manufacturing apparatus and a thermal insulation unit with which a temperature distribution for a growth space in which a SiC crystal is grown can be designed.

The inventors have found that, since the thermal conductivity of a heat insulating material can be freely designed by changing a filling rate of a filler filled into a container or the like, and combining these as a unit, a temperature distribution in the growth space in which a SiC crystal is grown is thus able to be designed.

Specifically, the present invention provides the following aspects in order to address the above problems.

(1) A SiC single crystal manufacturing apparatus according to a first aspect includes a growth container having a growth space in which a SiC single crystal is grown in a first direction therein and a heat insulating material which covers the growth container and includes a plurality of units, and the plurality of units include a first unit and a second unit having at least a thermal conductivity different from that of the first unit, and
the first unit includes a container made of at least one of graphite and a metal carbide and a filler filled into the container in a replaceable manner.

(2) In the SiC single crystal manufacturing apparatus according to the above aspect, the filler may be a powder or a plate material formed with SiC or metal carbide.

(3) In the SiC single crystal manufacturing apparatus according to the above aspect, the powder or the plate material formed with SiC or metal carbide may have shape anisotropy.

(4) In the SiC single crystal manufacturing apparatus according to the above aspect, the first unit may have anisotropy in thermal conductivity.

(5) In the SiC single crystal manufacturing apparatus according to the above aspect, the first unit may have a lower thermal conductivity than the second unit, the first unit may cover the outside of a lower wall that faces an upper wall of the growth container in which a single crystal is provided in the first direction, and the second unit may cover the outside of a side wall of the growth container in a radial direction intersecting the first direction.

(6) In the SiC single crystal manufacturing apparatus according to the above aspect, the first unit may have a higher thermal conductivity than the second unit, the first unit may cover the outside of an upper wall of the growth container in which a single crystal is provided in the first direction, and the second unit may cover the outside of a lower wall of the growth container that faces the upper wall in the first direction.

(7) In the SiC single crystal manufacturing apparatus according to the above aspect, the first unit may have a lower thermal conductivity than the second unit, the first unit may cover the outside of a first part that overlaps the single crystal on the upper wall of the growth container in which a single crystal is provided, in a plan view in the first direction, and the second unit may cover the outside of a second part other than the first part on the upper wall of the growth container on which a single crystal is provided.

(8) In the SiC single crystal manufacturing apparatus according to the above aspect, the first unit may have a higher thermal conductivity than the second unit, the first unit may cover the outside of a first part on the upper wall of the growth container that overlaps the single crystal provided in the growth container, in a plan view in the first direction on the upper wall of the growth container that overlaps the single crystal provided in the growth container, in a plan view in the first direction, and the second unit may cover the outside of a second part other than the first part on the upper wall of the growth container in which a single crystal is provided.

(9) A structure for manufacturing a SiC single crystal according to a second aspect is a structure for manufacturing a SiC single crystal which is used for a heat insulating material that covers a growth container in which a SiC single crystal is grown and a plurality of units are combined to form the heat insulating material, including a container made of graphite or a metal carbide and a filler filled into the container in a replaceable manner.

(10) A structure for manufacturing a SiC single crystal according to a third aspect is a structure for manufacturing a SiC single crystal that is provided between a growth container in which a SiC single crystal is grown and a heater that heats the growth container with radiant heat, the structure including; a container made of graphite or a metal carbide; and a filler filled into the container in a replaceable manner, and a thermal conductivity in a first direction is different from a thermal conductivity in a second direction that intersects the first direction.

In the SiC single crystal manufacturing apparatus and the structures for producing a SiC single crystal according to the above aspects, a temperature distribution of a growth space in which a SiC crystal is grown can be designed.

DETAILED DESCRIPTION OF THE INVENTION

Figure 1:
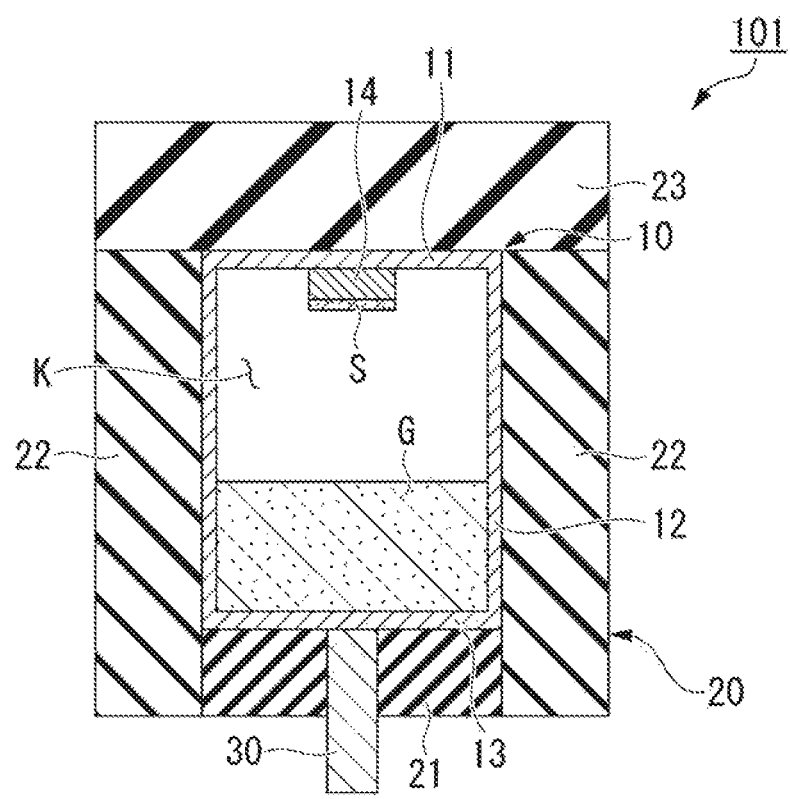
FIG. 1 is a cross-sectional view of an example of a SiC single crystal manufacturing apparatus according to a first embodiment.

The present embodiment will be appropriately described below in detail with reference to the drawings. In the drawings used in the following description, feature parts are enlarged for convenience of illustration, in some cases, and size ratios and the like of components may be different from those of actual components. The material, sizes, and the like exemplified in the following description are examples, and the present invention is not limited thereto, and it can be realized by appropriate modification thereof without departing from the spirit and scope of the invention.

First Embodiment

FIG. 1 is a cross-sectional view of an example of a SiC single crystal manufacturing apparatus according to a first embodiment. A SiC single crystal manufacturing apparatus 101 shown in FIG. 1 includes a growth container 10, a heat insulating material 20, and a support 30. The growth container 10 has a growth space K therein. In the growth space K, a raw material G and a seed crystal S are disposed to face each other. In FIG. 1, in order to facilitate understanding, the raw material G and the seed crystal S are shown at the same time.

First, directions will be defined. A direction from the raw material G to the seed crystal S in the manufacturing apparatus 101 is defined as a first direction. The first direction is, for example, a vertical direction in FIG. 1. Hereinafter, for convenience, the side on which the seed crystal S is provided in the growth space K will be termed "above," and the side to which the raw material G is filled will be termed "below." In addition, a direction that is normal to (is substantially orthogonal to) the first direction is defined as a radial direction. The radial direction is, for example, a left to right direction in FIG. 1.

The growth container 10 is, for example, a crucible or furnace used for growing a SiC single crystal. When a sublimation method is used, the growth container 10 is a crucible, and when a gas method or the like is used, the growth container 10 is a furnace. The growth container 10 is heated according to induction heating from a coil or the like provided in the growth container 10 in the radial direction.

The growth container 10 includes an upper wall 11, a side wall 12, a lower wall 13, and a crystal installation part 14. The upper wall 11, the side wall 12, and the lower wall 13 surround the growth space K. The raw material G is filled in to the side of the lower wall 13 of the growth space K. The upper wall 11 is provided in the growth container 10 on the crystal installation part 14 side in the first direction. The lower wall 13 faces the upper wall 11. The side wall 12 connects the upper wall 11 to the lower wall 13 and intersects the radial direction. The crystal installation part 14 is positioned on the side of the growth space K of the upper wall 11. In the crystal installation part 14, the seed crystal S is provided.

The heat insulating material 20 covers the growth container 10. The heat insulating material 20 includes a plurality of units. The heat insulating material 20 shown in FIG. 1 includes a first unit 21, a second unit 22, and a third unit 23.

The first unit 21 covers the outside of the lower wall 13 of the growth container 10. The second unit 22 covers the outside of the side wall 12 of the growth container 10. The third unit 23 covers the outside of the upper wall 11 of the growth container 10.

Figure 2:
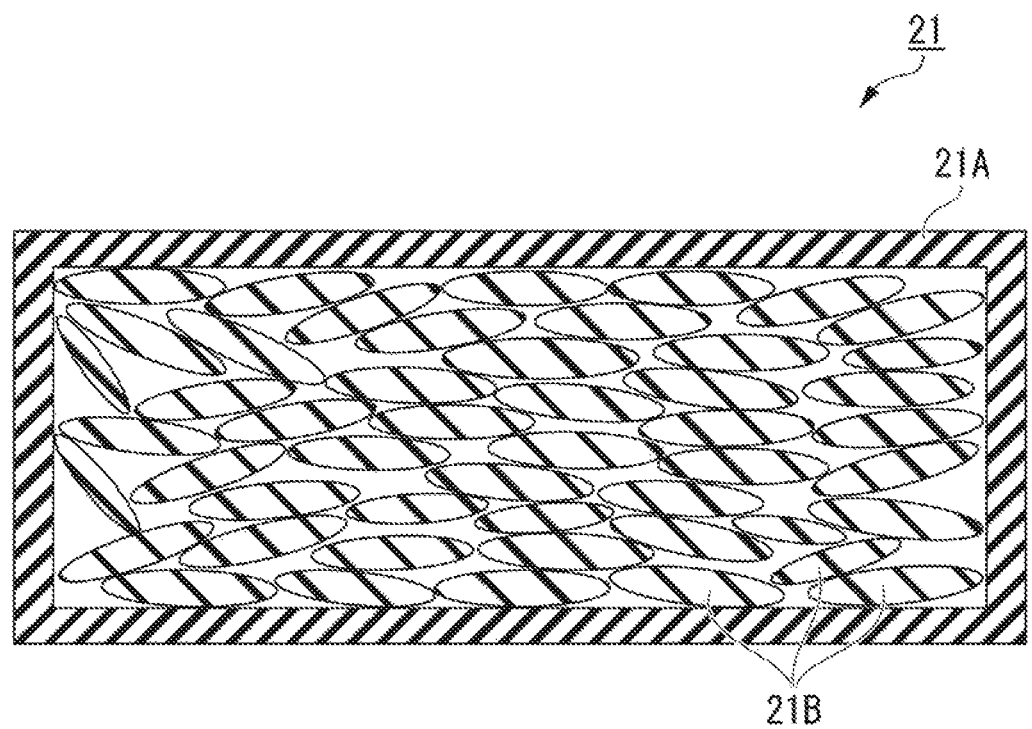
FIG. 2 is a cross-sectional view of a first unit of a heat insulating material constituting the SiC single crystal manufacturing apparatus according to the first embodiment.

FIG. 2 is a cross-sectional view of the first unit 21 of the heat insulating material 20 constituting the SiC single crystal manufacturing apparatus 101 according to the first embodiment. The first unit 21 includes a container 21A and a filler 21B.

The container 21A includes graphite or a metal carbide. The entire container 21A may be made of graphite or a metal carbide, or part of the container 21A may be made of graphite and the other part thereof may be made of a metal carbide.

The filler 21B can be replaced. The filler 21B shown in FIG. 2 has a long axis and a short axis, and has shape anisotropy. The filler 21B shown in FIG. 2 is, for example, a whisker. When the filler 21B has shape anisotropy, thermal conductivities are different in the first direction and a second direction. That is, the filler 21B has anisotropy in thermal conductivity. The first direction is a direction in which the long axis of the filler 21B is mainly aligned. The second direction is a direction in which the short axis of the filler 21B is mainly aligned. Mainly aligned refers to, for example, an alignment in a direction obtained by combining vector directions of long axes or short axes of 10 arbitrarily selected fillers 21B.

The filler 21B is not limited to a powder having shape anisotropy as shown in FIG. 2. The filler 21B may be particles having no shape anisotropy or a plate material. The filler 21B is made of, for example, graphite, SiC, or a metal carbide (for example, TaC). The filler 21B is preferably made of SiC or a metal carbide. The metal carbide hardly reacts with a Si-based gas leaking from the growth space K.

For example, the second unit 22 and the third unit 23 may have the same configuration as the first unit 21. The second unit 22 and the third unit 23 may be a molded heat insulating material utilizing carbon fibers.

The first unit 21 has a thermal conductivity different from that of the second unit 22. In the manufacturing apparatus 101 shown in FIG. 1, the first unit 21 has a thermal conductivity lower than that of the second unit 22. The thermal conductivity of the third unit 23 is not particularly limited. The thermal conductivity of the third unit 23 is, for example, substantially the same as that of the second unit 22. The thermal conductivities of the first unit 21, the second unit 22, and the third unit 23 are preferably 10 W/mk or less at a high temperature of 2,000° C. or higher.

The effective thermal conductivity of the first unit 21 is controlled by the filling rate of the filler 21B, the thermal conductivity of the filler 21B itself, the size of the filler 21B, and the like. The effective thermal conductivities of the second unit 22 and the third unit 23 are the same.

The effective thermal conductivity is represented by the following Formula (1).

$$k_{eff} = (1-\varepsilon_p)k + \varepsilon_p(k_{gas} + 8/3 \varepsilon \sigma 4T^3 d_p) \quad (1)$$

In Formula (1), $k_{eff}$ represents an effective thermal conductivity, $\varepsilon_p$ represents a porosity in the container 21A, $k_{gas}$ is a thermal conductivity of a gas in the container 21A, E represents an emissivity, σ represents the Stefan-Boltzmann constant, T represents a temperature, and $d_p$ represents a particle size.

According to Formula (1), when the average particle size of the raw material powder and the porosity of the raw material are changed, the effective thermal conductivity varies. For example, when the average particle size of the raw material powder increases, the thermal conductivity increases. In addition, in a SiC sublimation temperature range (2,000° C. or higher and 2,500° C. or lower), when the porosity become higher, the thermal conductivity of the raw material becomes lower.

The support 30 supports the growth container 10 from below. The support 30 may be rotatable. When the support 30 rotates, the raw material G is uniformly heated. The support 30 is made of, for example, a graphite material. The thermal conductivity of the support 30 is higher than that of a molded heat insulating material using carbon fibers.

According to the manufacturing apparatus 101, a temperature distribution of the growth space K in which a SiC crystal is grown can be controlled. The support 30 has a higher thermal conductivity than the heat insulating material 20. Heat of the growth container 10 easily dissipates downward via the support 30. It is possible to reduce dissipation of heat via the support 30 by reducing the thermal conductivity of the first unit 21. As a result, the raw material G positioned in the lower part of the growth space K is efficiently heated. When the raw material G is efficiently heated, a raw material gas is efficiently sublimated and a single crystal is grown larger.

In addition, the thermal conductivity of the first unit 21 can be designed freely according to a filling rate of the filler 21B or the like. A temperature distribution in the growth space K can be designed by designing thermal conductivities of the first unit 21, the second unit 22, and the third unit 23.

In addition, the filler 21B in the first unit 21 can be replaced. For example, when the filler 21B is made of graphite, the filler 21B reacts with a Si-based gas leaking from the growth container 10. When the filler 21B is replaceable, a replacement frequency of the entire heat insulating material 20 is reduced, and SiC single crystal production costs can be reduced.

In addition, when the container 21A of the first unit 21 is made of graphite, the container 21A can be produced at low cost. On the other hand, when the container 21A of the first unit 21 is made of a metal carbide, the metal carbide is an insulator and is not heated with induction from a coil, and thus it can be disposed near the coil.

MODIFIED EXAMPLES

Figure 3:
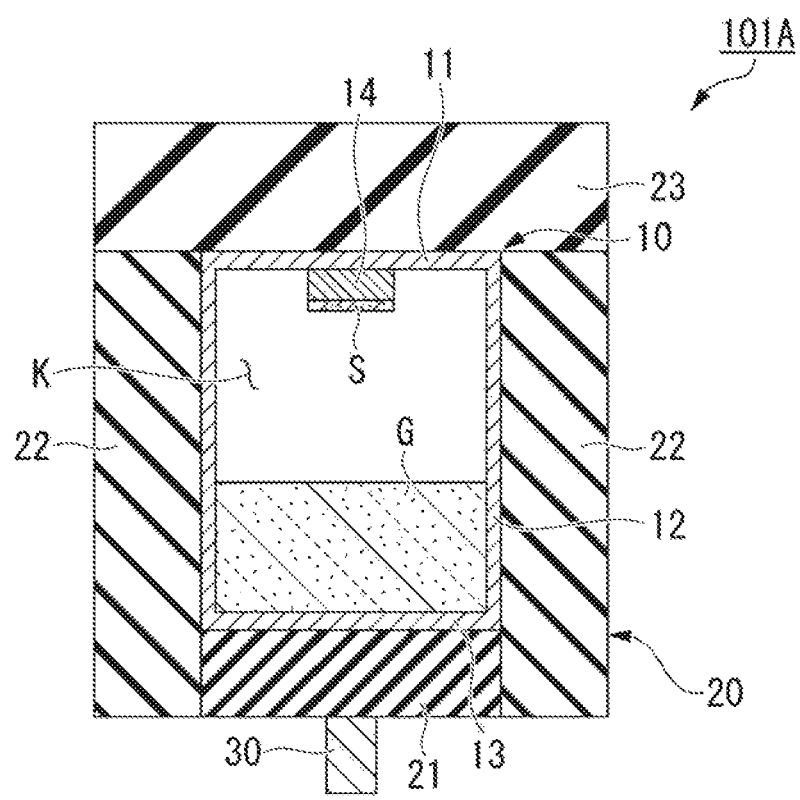
FIG. 3 is a cross-sectional view of a modified example of the SiC single crystal manufacturing apparatus according to the first embodiment.

FIG. 3 is a cross-sectional view of a modified example of a SiC single crystal manufacturing apparatus according to the first embodiment. A manufacturing apparatus 101A according to a modified example is different from the manufacturing apparatus 101 according to the above example in that the support 30 does not directly support the growth container 10. The other components are the same and denoted with the same reference numerals.

The support 30 supports the growth container 10 via the first unit 21. The first unit 21 is rotatable together with the support 30. The first unit 21 has a lower thermal conductivity than the support 30. When the growth container 10 is supported via the first unit 21, dissipation of heat via the support 30 can be further reduced.

Second Embodiment

Figure 4:
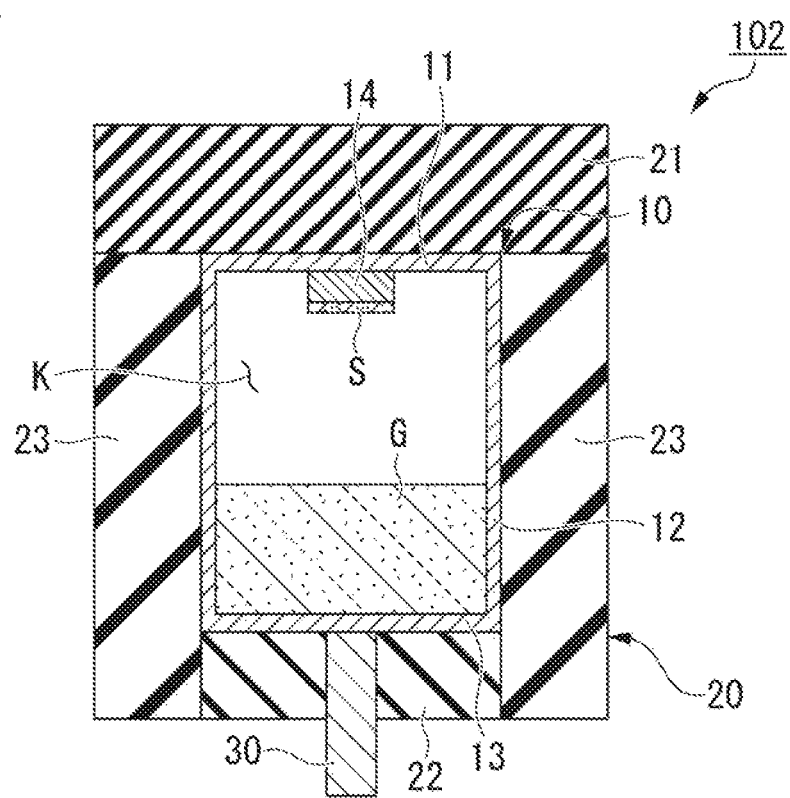
FIG. 4 is a cross-sectional view of an example of a SiC single crystal manufacturing apparatus according to a second embodiment.

FIG. 4 is a cross-sectional view of an example of a SiC single crystal manufacturing apparatus according to a second embodiment. In a SiC single crystal manufacturing apparatus 102 shown in FIG. 2, an arrangement of units constituting the heat insulating material 20 is different from that of the SiC single crystal manufacturing apparatus 101 shown in FIG. 1. The other components are the same and the same components are denoted with the same reference numerals.

In the manufacturing apparatus 102, the first unit 21 covers the outside of the upper wall 11 of the growth container 10. The second unit 22 covers the outside of the lower wall 13 of the growth container 10. The third unit 23 covers the outside of the side wall 12 of the growth container 10.

The first unit 21 has a thermal conductivity different from that of the second unit 22. In the manufacturing apparatus 102 shown in FIG. 4, the first unit 21 has a thermal conductivity higher than that of the second unit 22. The thermal conductivity of the third unit 23 is not particularly limited. The thermal conductivity of the third unit 23 is, for example, substantially the same as that of the second unit 22 and is lower than the thermal conductivity of the second unit 22.

When the thermal conductivity of the first unit 21 is higher than the thermal conductivity of the second unit 22, the side of the first unit 21 having a higher thermal conductivity has a lower temperature in the growth space K than the side of the second unit 22. That is, the upper wall 11 of the growth container 10 has a lower temperature than the lower wall 13. A SiC single crystal is grown when a raw material gas sublimated from the raw material G is recrystallized on the surface of the seed crystal S. In order to increase sublimation efficiency, it is preferable to increase the temperature of the raw material G, and in order to increase recrystallization efficiency, it is preferable to relatively lower the temperature in the vicinity of the seed crystal S. Therefore, when the temperature of the upper wall 11 is lower than the temperature of the lower wall 13, single crystal growth efficiency increases. In addition, a flow of a gas from the raw material G to the seed crystal S is formed according to a temperature distribution. According to the gas flow, single crystal growth efficiency increases and a larger single crystal is obtained.

As described above, according to the manufacturing apparatus 102 of the second embodiment, a temperature distribution of the growth space K in which a SiC crystal is grown can be controlled.

Third Embodiment

Figure 5:
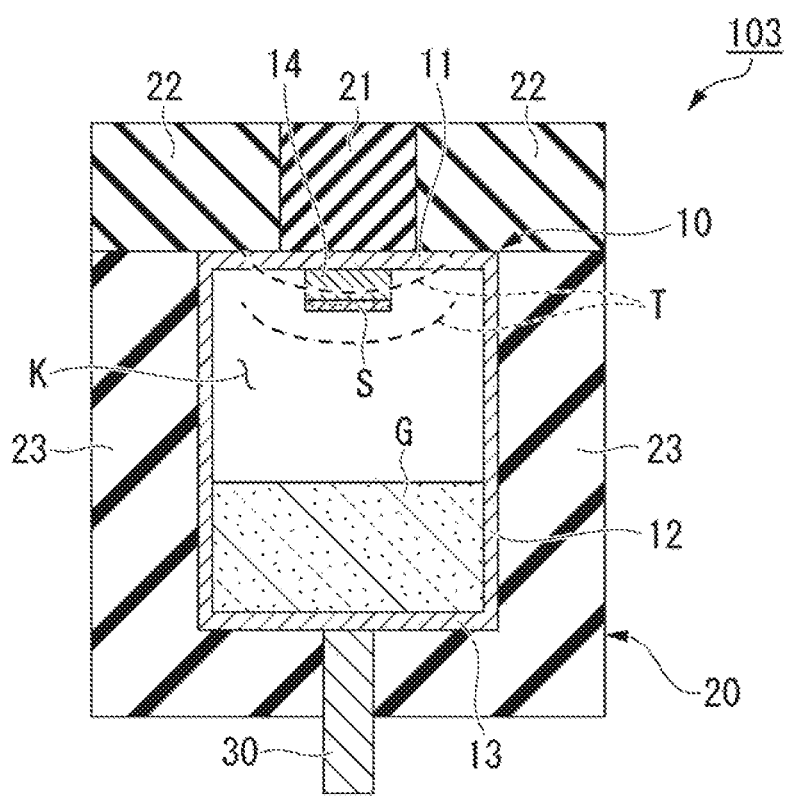
FIG. 5 is a cross-sectional view of an example of a SiC single crystal manufacturing apparatus according to a third embodiment.

FIG. 5 is a cross-sectional view of an example of a SiC single crystal manufacturing apparatus according to a third embodiment. In a SiC single crystal manufacturing apparatus 103 shown in FIG. 3, an arrangement of units constituting the heat insulating material 20 is different from that of the SiC single crystal manufacturing apparatus 101 shown in FIG. 1. The other components are the same and the same components are denoted with the same reference numerals.

In the manufacturing apparatus 103, the first unit 21 covers the outside of the first part of the upper wall 11 of the growth container 10. In the first part, the upper wall 11 and the single crystal (the seed crystal S) overlap in the first direction in a plan view. The second unit 22 covers the outside of the second part of the upper wall 11 of the growth container 10. The second part is a part other than the first part in the upper wall 11. The third unit 23 covers the outside of the side wall 12 and the lower wall 13 of the growth container 10.

The first unit 21 has a thermal conductivity different from that of the second unit 22. In the manufacturing apparatus 103 shown in FIG. 5, the first unit 21 has a thermal conductivity lower than that of the second unit 22. The thermal conductivity of the third unit 23 is not particularly limited. The thermal conductivity of the third unit 23 is, for example, substantially the same as that of the second unit 22 or is higher than the thermal conductivity of the second unit 22.

When the thermal conductivity of the first unit 21 is higher than the thermal conductivity of the second unit 22, an isothermal surface T in the vicinity of the crystal installation part 14 is convex toward the raw material G. Since the single crystal is grown along the isothermal surface, a single crystal having a convex growth surface is obtained.

As described above, according to the manufacturing apparatus 103 of the third embodiment, a temperature distribution of the growth space K in which a SiC crystal is grown can be controlled.

Fourth Embodiment

Figure 6:
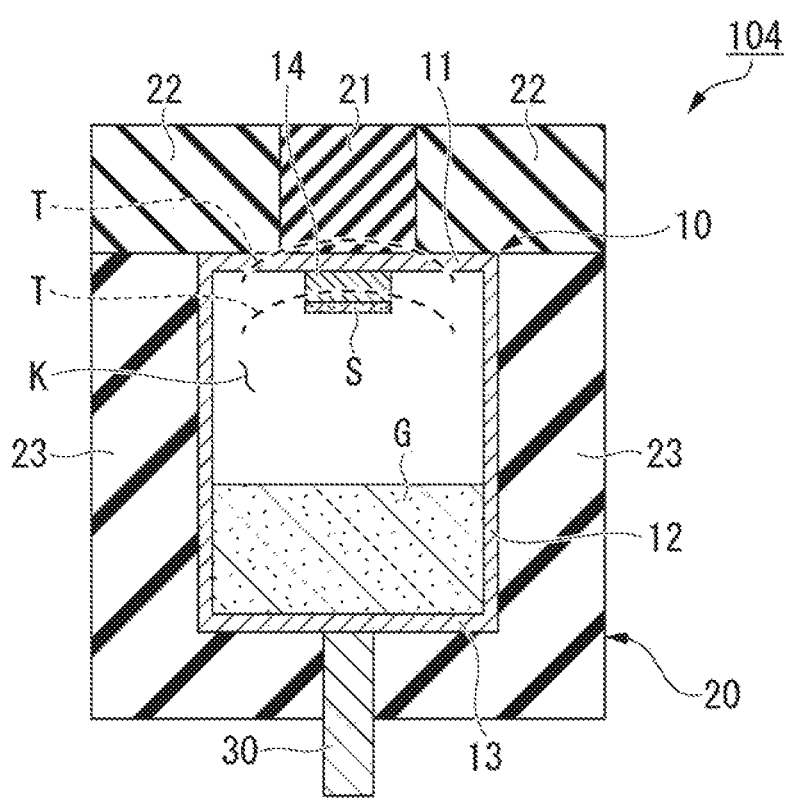
FIG. 6 is a cross-sectional view of an example of a SiC single crystal manufacturing apparatus according to a fourth embodiment.

FIG. 6 is a cross-sectional view of an example of a SiC single crystal manufacturing apparatus according to a fourth embodiment. The SiC single crystal manufacturing apparatus 103 shown in FIG. 6 is different from the SiC single crystal manufacturing apparatus 103 according to the third embodiment in that the relationship between thermal conductivities of the first unit 21 and the second unit 22 is opposite. The other components are the same and the same components are denoted with the same reference numerals.

In a manufacturing apparatus 104, the first unit 21 covers the outside of the first part of the upper wall 11 of the growth container 10. The second unit 22 covers the outside of the second part of the upper wall 11 of the growth container 10. The third unit 23 covers the outside of the side wall 12 and the lower wall 13 of the growth container 10.

The first unit 21 has a thermal conductivity different from that of the second unit 22. In the manufacturing apparatus 103 shown in FIG. 6, the first unit 21 has a thermal conductivity higher than that of the second unit 22. The thermal conductivity of the third unit 23 is not particularly limited. The thermal conductivity of the third unit 23 is, for example, substantially the same as that of the second unit 22 or is higher than the thermal conductivity of the second unit 22.

When the thermal conductivity of the first unit 21 is lower than the thermal conductivity of the second unit 22, the isothermal surface T in the vicinity of the crystal installation part 14 is recessed toward the side opposite to the raw material G. Since the single crystal is grown along the isothermal surface, a single crystal having a concave growth surface is obtained.

As described above, according to the manufacturing apparatus 104 of the fourth embodiment, a temperature distribution of the growth space K in which a SiC crystal is grown can be controlled.

Fifth Embodiment

Figure 7:
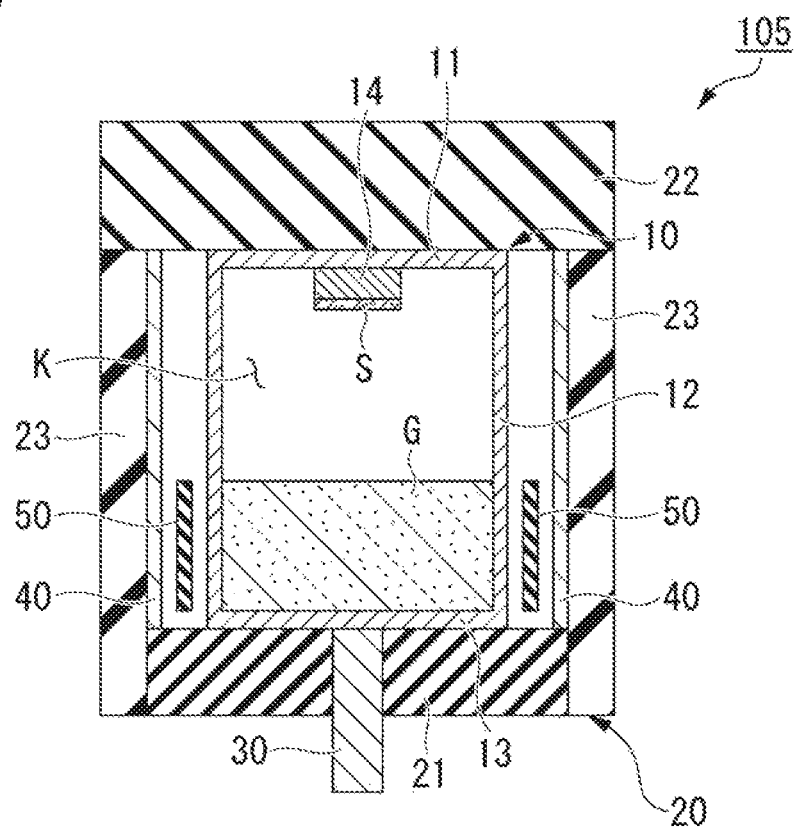
FIG. 7 is a cross-sectional view of an example of a SiC single crystal manufacturing apparatus according to a fifth embodiment.

FIG. 7 is a cross-sectional view of an example of a SiC single crystal manufacturing apparatus according to a fifth embodiment. A SiC single crystal manufacturing apparatus 105 shown in FIG. 7 is different from the SiC single crystal manufacturing apparatus 101 according to the first embodiment in that a heater 40 and an alignment material 50 are provided between the heat insulating material 20 and the growth container 10. The other components are the same and the same components are denoted with the same reference numerals.

The heater 40 is positioned outside the growth container 10 and inside the heat insulating material 20. The heater 40 receives heat radiation generated from a coil (not shown) positioned on the outer periphery of the heat insulating material 20 and is heated with induction heat. The heater 40 that has generated heat itself becomes a heat radiation generation source, and heats the growth container 10 with radiant heat. The heater 40 is, for example, a graphite member.

The alignment material 50 includes a container and a filler filled into the container. The alignment material 50 has the same configuration as the first unit 21. The alignment material 50 has different thermal conductivities in the first direction and the second direction. That is, the alignment material 50 has anisotropy in thermal conductivity. The anisotropy of thermal conductivity of the alignment material 50 is formed by, for example, an aspect ratio of a filler to be filled, a material of a filler, and the like. The thermal conductivity of the alignment material 50 in the first direction is higher than the thermal conductivity in the radial direction.

Heat transmitted to the alignment material 50 from the heater 40 by radiation is more easily transmitted in the first direction than in the radial direction. Therefore, heat spreads in the first direction in the alignment material 50. Heat spread in the first direction by the alignment material 50 heats the growth container 10. The alignment material 50 reduces a temperature gradient in the first direction and enables soaking of the raw material G.

In addition, when the container of the alignment material 50 is made of graphite, the alignment material 50 also serves as a heat radiation generation source. Therefore, the alignment material 50 functions as a second heater.

As described above, according to the manufacturing apparatus 104 of the fourth embodiment, a temperature distribution of the growth space K in which a SiC crystal is grown can be controlled.

Whiles several embodiments have been described above, the embodiments are not limited to the above examples. For example, features of the first embodiment to the fifth embodiment may be combined.

EXPLANATION OF REFERENCES

10 Growth container
11 Upper wall
12 Side wall
13 Lower wall
14 Crystal installation part
20 Heat insulating material
21 First unit
21A Container
21B Filler
22 Second unit
23 Third unit
30 Support
40 Heater
50 Alignment material
101, 101A Manufacturing apparatus
G Raw material
K Growth space
S Seed crystal
T Isothermal surface

What is claimed is:

1. A SiC single crystal manufacturing apparatus, comprising:
    a growth container having a growth space in which a SiC single crystal is able to grow in a first direction therein; and
    a heat insulating material which covers the growth container and includes a plurality of units,
    wherein the plurality of units include a first unit and a second unit having at least a thermal conductivity different from that of the first unit,
    wherein the first unit includes a container made of at least one of graphite and a metal carbide and a filler filled into the container in a replaceable manner, and
    wherein the filler is a powder material formed with SiC or metal carbide.

2. The SiC single crystal manufacturing apparatus according to claim 1,
    wherein the powder material formed with SiC or metal carbide has shape anisotropy.

3. The SiC single crystal manufacturing apparatus according to claim 1,
    wherein the first unit has anisotropy in thermal conductivity.

4. The SiC single crystal manufacturing apparatus according to claim 1,
    wherein the first unit has a lower thermal conductivity than the second unit,
    wherein the first unit covers the outside of a lower wall that faces an upper wall of the growth container in which a single crystal is provided in the first direction, and
    wherein the second unit covers the outside of a side wall of the growth container in a radial direction intersecting the first direction.

5. The SiC single crystal manufacturing apparatus according to claim 1,
    wherein the first unit has a higher thermal conductivity than the second unit,
    wherein the first unit covers the outside of an upper wall of the growth container in which a single crystal is provided in the first direction, and
    wherein the second unit covers the outside of a lower wall of the growth container that faces the upper wall in the first direction.

6. The SiC single crystal manufacturing apparatus according to claim 1,
    wherein the first unit has a lower thermal conductivity than the second unit,
    wherein the first unit covers the outside of a first part that overlaps a single crystal on the upper wall of the growth container in which the single crystal is provided, in a plan view in the first direction, and
    wherein the second unit covers the outside of a second part other than the first part on the upper wall of the growth container on which the single crystal is provided.

7. The SiC single crystal manufacturing apparatus according to claim 1,
    wherein the first unit has a higher thermal conductivity than the second unit,
    wherein the first unit covers the outside of a first part on the upper wall of the growth container that overlaps a single crystal provided in the growth container, in a plan view in the first direction, and
    wherein the second unit covers the outside of a second part other than the first part on the upper wall of the growth container in which the single crystal is provided.

8. The SiC single crystal manufacturing apparatus according to claim 1,
wherein the container is made of a metal carbide.

9. The SiC single crystal manufacturing apparatus according to claim 1,
wherein the first unit is made of the container and the filler.

* * * * *